United States Patent [19]

Hasegawa

[11] Patent Number: 5,122,793
[45] Date of Patent: Jun. 16, 1992

[54] SIGNAL GENERATOR FOR GENERATING AN IMAGE SIGNAL OF AN INPUT SIGNAL

[75] Inventor: Masao Hasegawa, Osaka, Japan

[73] Assignee: NEC Home Electronics Ltd., Osaka, Japan

[21] Appl. No.: 479,677

[22] Filed: Feb. 14, 1990

Related U.S. Application Data

[63] Continuation-in-part of Ser. No. 235,941, Aug. 24, 1988, abandoned.

[30] Foreign Application Priority Data

Aug. 26, 1987 [JP] Japan .................. 62-212584

[51] Int. Cl.⁵ .............................................. H04Q 9/00
[52] U.S. Cl. .................. 340/825.140; 340/825.200; 341/22; 341/26
[58] Field of Search .......... 340/825.14, 825.2, 825.17, 340/825.73, 825.76, 825.89; 341/22, 26, 173, 177; 307/352, 353, 269; 328/14, 34, 63, 151; 370/85.11, 103; 375/109

[56] References Cited

U.S. PATENT DOCUMENTS

| | | | |
|---|---|---|---|
| 3,662,378 | 5/1972 | MacArthur | 341/173 |
| 3,835,454 | 9/1974 | Palmieri et al. | 340/825.73 |
| 3,893,033 | 7/1975 | Finch | 328/63 |
| 4,163,222 | 7/1979 | Gove | 341/26 |
| 4,164,730 | 8/1979 | Weckenmann et al. | 340/825.14 |
| 4,231,016 | 10/1980 | Ueda | 340/825.89 |
| 4,414,639 | 11/1983 | Talambiras | 307/269 |

OTHER PUBLICATIONS

"Backup Application Technique", published Nov. 15, 1985, Radio Life.

Primary Examiner—Donald J. Yusko
Assistant Examiner—Edwin C. Holloway, III
Attorney, Agent, or Firm—Cushman, Darby & Cushman

[57] ABSTRACT

A signal generator for generating an output signal that is an accurate image of an input signal. A keyboard transmits an input signal and an image controlling device receives the input signal. The image controlling device includes a level variation detecting device which samples the input signal at a sampling rate determined by a sampling period generating device. When the level variation detecting device detects a variation in the levels of a currently sampled value and a previously sampled value it adjusts the image signal accordingly so that the output signal is an accurate image of the input signal. A synchronization signal transmitter transmits a synchronization signal to the keyboard. The keyboard includes a counter which counts the synchronization signal. The counter generates the input image signal that is transmitted to the image controlling device. The synchronization signal transmitter provides synchronization between the image signal and the sampling device so that level variations in the input signal are designed to change in synchronization with the sampling rate. Accordingly, the level variation detecting device can detect any level variations in the input signal accurately.

7 Claims, 6 Drawing Sheets

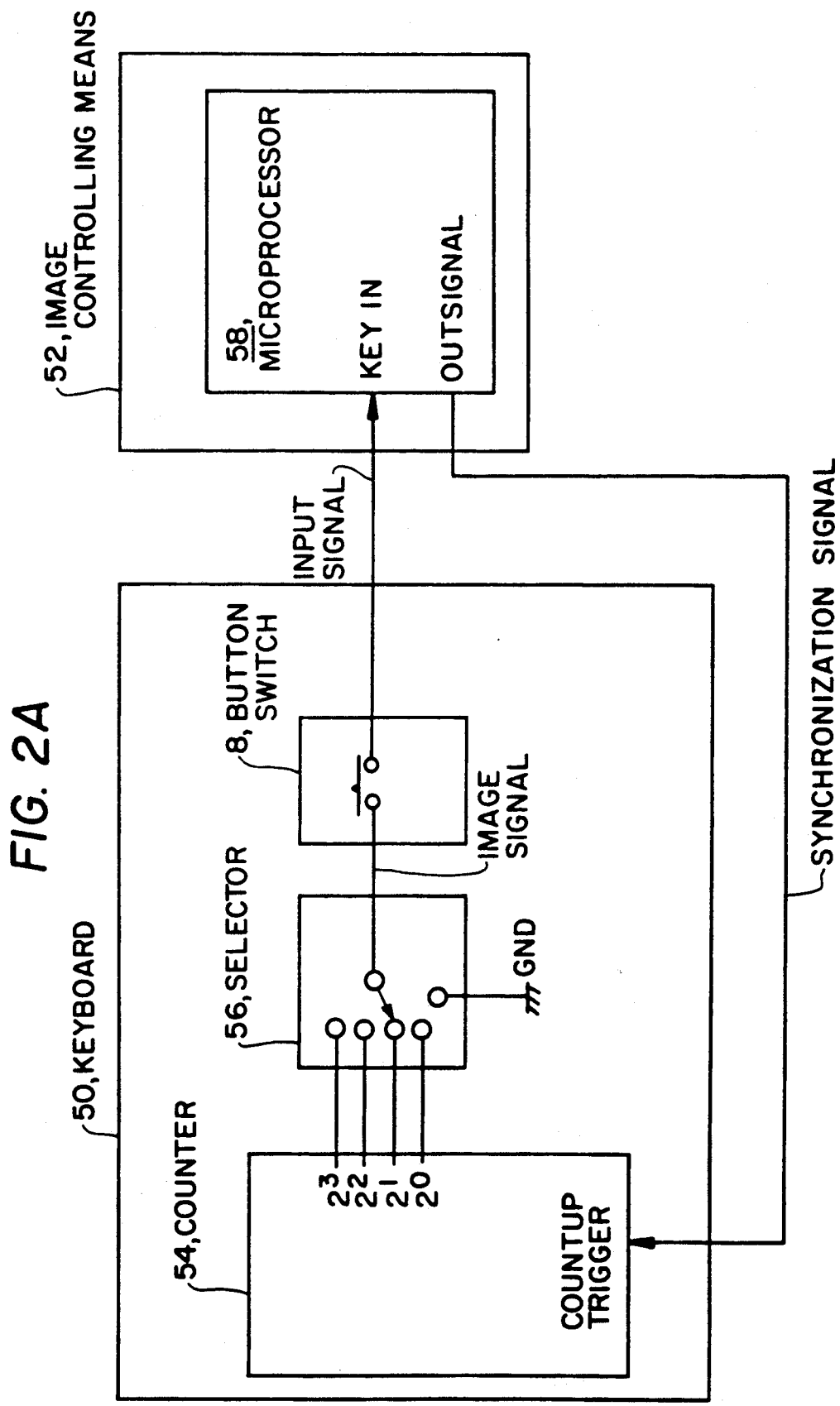

FIG. 3

| SELECTOR POSITION | OUTPUT SIGNALS FROM N-ARY COUNTER | | | |
|---|---|---|---|---|
| GND | $2^3$ | $2^2$ | $2^1$ | $2^0$ |
| | 0 | 0 | 0 | 0 |
| | 0 | 0 | 0 | 1 |
| | 0 | 0 | 1 | 0 |
| | 0 | 0 | 1 | 1 |
| | 0 | 1 | 0 | 0 |
| | 0 | 1 | 0 | 1 |
| | 0 | 1 | 1 | 0 |
| | 0 | 1 | 1 | 1 |
| | 1 | 0 | 0 | 0 |
| | 1 | 0 | 0 | 1 |
| | 1 | 1 | 1 | 1 |

SIGNAL GENERATOR FOR GENERATING AN IMAGE SIGNAL OF AN INPUT SIGNAL

This is a continuation-in-part of application Ser. No. 07/235,941, filed Aug. 24, 1988, now abandoned.

BACKGROUND OF THE INVENTION

1. Field of the Invention

The present invention is generally directed to a signal generator that samples an input and generates a signal that is an image of the input signal. More particularly, the invention is directed to a signal generator in which the level variations of the input signal change in synchronization with the sampling rate.

2. Description of the Prior Art

Signal generators have been used to generate a signal that is an image of an input signal. An image of an input signal is a signal that is the mirror-like reflection of the input signal. FIG. 1A illustrates such a signal generator. Typically, the signal generator includes a keyboard 2, and an image controlling means 4. Keyboard 2 typically includes a button switch 8; an oscillator 10; a change-over switch 12 which includes three terminals 12c, 12d and 12e. Change-over switch 12 selectively connects oscillator 10 to one of the terminals 12c, 12d, or 12e. Contact 12e is an earth (ground) contact and contacts 12c and 12d are connected to time constant circuits 12a and 12b, respectively. Time constant circuits 12a and 12b each include a capacitor and a resistor designed to alter the output signal from oscillator 10. The frequency of the signal from oscillator 10 is a function of which time constant circuit is connected to the oscillator 10. Button switch 8, oscillator 10 and change-over switch 12 are connected in a circuit. If the button switch 8 is not pressed, the circuit is open and no output signal is transmitted from oscillator 10. When button switch 8 is pressed, the output signal of oscillator 10 (which is dependent on the switch status of changeover switch 12), a continuously level-varying signal, is transmitted to image controlling means 4.

The image controlling means 4 includes a microprocessor 6 which receives the input signal from the keyboard 2 via a KEY IN terminal. The microprocessor 6 internally samples the input signal by making an instantaneous measure of the amplitude value of the input signal.

FIG. 1B is a block diagram showing the microprocessor 6 of the image processing means 4 of the prior art. The microprocessor 6 includes a level variation detecting means 20 which includes an input port 20a, and a sampling period generating means 22 which includes a timer 22a. Both the level variation detecting means 20 and the sampling period generating means 22 are controlled by software executed by a control section 24. The level variation detecting means 20 and the sampling period generating means 22 are coupled to the control section 24 by a first internal bus 26a.

The microprocessor 6 also includes: a bus interface register 28; an instruction register 30; an instruction decoder 32; data registers 34 and 36 which are connected to an arithmetic logic unit (ALU) 38; a plurality of control registers 40; second, third and fourth internal busses 26b, 26c and 26d; a lower address register 42a; and an upper address register 42b.

As shown in FIG. 1B, the input signal from the KEY IN terminal is latched by the input port 20a of the level variation detecting means 20. The latched input signal is output to the control section 24 via the first internal bus 26a. The control section outputs to the timer 22a of the sampling period generating means 22 a control frequency command which causes the timer 22a to generate a sample signal at a frequency in accordance with the control frequency command.

The sampling period generating means 22 outputs the sample signal at the above-mentioned frequency. In response to the sample signal, the level variation detecting means 20 samples the input signal (i.e. signal output from keyboard 2). The level variation detecting means 20 samples the input signal in response to the sample signal from the sampling period generating means 22. Sampling in general is understood to mean an instantaneous measure of the amplitude value of the input signal. Thus, the level variation detecting means 20 samples the input signal by latching the input signal in response to the sample signal from the sampling period generating means 22. The level variation detecting means 20 includes, for example, a memory unit such as a Flip-flop and a RAM which are able to store the value of the sampled input signal.

Level variation detecting means 20 detects when the level of the sampled input signal varies from the previously sampled signal by comparing the currently sampled level with the previously sampled level stored in the memory unit of level variation detecting means 20.

The signal generator of FIG. 1A and 1B operates as follows. When change-over switch 12 is set so that one of the two time constant circuits 12a and 12b are connected in circuit with oscillator 10, oscillator 10 generates an oscillating signal at a frequency corresponding to the time constant of the time constant circuit chosen, either 12a or 12b. When button switch 8 is pressed, a signal from oscillator 10, a continuously level-varying signal, is transmitted from keyboard 2. When button switch 8 is not pressed no signal from oscillator 10 is transmitted from keyboard 2.

If change-over switch 12 is switched so that oscillator 10 is connected to ground terminal 12e, the output from oscillator 10 is essentially ground level. As a result, the input signal is ground level while the change-over switch 12 is switched.

The signal generated from oscillator 10 is transmitted from keyboard 2 to level variation detecting means 20 in the image controlling means 4. Level variation detecting means 20 receives a sample signal from sampling period generating means 22 as discussed above. The sampled input signal is compared to the sampled signal taken during the previous sampling period. Level variation detecting means 20 detects any level variation between the current sampled value of the input signal and the previously sampled value. If level variation detecting means 20 has detected a level variation in the input signal, it causes a change to occur in the image signal of the input signal so that the image signal mirrors the input signal. Therefore, the signal generator creates a signal that is the image of the input signal created by oscillator 10.

In the signal generator described above, there is no means for synchronizing the signal generated by oscillator 10 with the sampling command sent from sampling period generating means 22. Because of this, level variations that occur in the input signal may go undetected in the image controlling means 4. Level variation detecting means 20 of the prior art generators receive sampled input signal values that have been sampled according to the command sent from sampling period generating means 22. If level variation detecting means 20 only samples the input signal when the level of the input signal is "high", for example, there will be no detection of any level variations in the input signal even though during the period of time when the input signal is not being sampled its levels may vary continuously. The reason for this is that the previously sampled input signal is compared with the currently sampled input signal. Since, in the example described above, the input signal is only sampled at its "high" level there is no variation between these two sampled values for level detecting means 20 to detect. As a result the image signal of the input signal will not accurately reflect the input signal because of the fact that not all of the level variations of the input signal were detected.

SUMMARY OF THE INVENTION

Accordingly, it is a primary object of the present invention to provide accurate detection of level variations in the input signal by providing synchronizing means between the input signal and the sampling means.

Another object of the present invention is to provide a signal generator that generates a true image signal of an input signal.

To accomplish these objectives, there is provided a signal generator which includes a keyboard for transmitting an input signal and an image controlling means for receiving the input signal. The image controlling means includes a level variation detecting means which samples the input signal at a sampling rate determined by a sampling period generating means. When the level variation detecting means detects a variation in the level of a currently sampled value, the detected variation is recognized to be an actual image signal of an input signal or actual input signal.

The image controlling means of the present invention provides a synchronization signal transmitting means in the image controlling means for transmitting a synchronization signal to the keyboard. The keyboard is provided with a counting means to count the synchronization signal. In response to the counting of the synchronization signal, the counting means generates one or more than two continuous level-varying signals. Thus, the synchronization signal transmitting means provides synchronization between the input signal and the sampling means so that the level variations in the input signal are made in synchronism with the sampling rate.

In this way the input signal transmitted from the keyboard is accurately sampled, thus detecting all changes in the input signal.

The present invention also provides a method for generating an output signal that is an image of an input signal. The method comprises the steps of generating a sampling signal, synchronizing the input signal and the sampling signal so that level variations of the input signal occur in synchronization with the sampling signal, sampling the input signal, and detecting a level variation between successive sampled values of the input signal. After the level variations are detected, the image signal is adjusted according to the detected level variations so that the output signal is an image of the input signal.

Further objects and advantages will be apparent from the following description and the accompanying drawings.

BRIEF DESCRIPTION OF THE DRAWINGS

FIG. 2A is a block diagram of a signal generator in accordance with the present invention.

FIG. 3 is an explanatory diagram showing the operation of the counting means of FIG. 2A in accordance with the present invention.

DETAILED DESCRIPTION OF THE PREFERRED EMBODIMENT

Figure 1A:
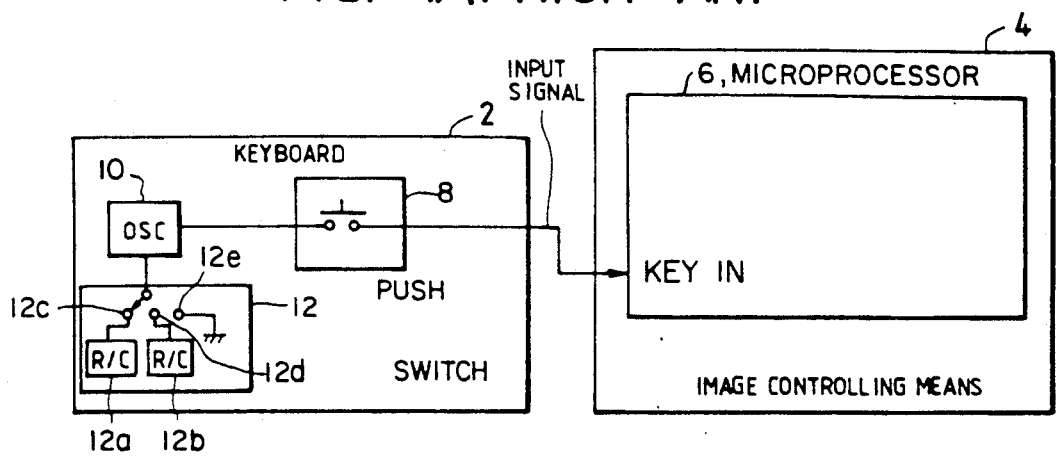
FIG. 1A (PRIOR ART) is a block diagram illustrating a prior art signal generator.

The preferred embodiment of the signal generator of the present invention will hereinafter be described in detail with reference to the accompanying drawings. Throughout the drawings, like reference numerals or letters will designate like or equivalent elements for simplicity of explanation.

FIG. 2A is a block diagram of a signal generator in accordance with the present invention. The signal generator includes a keyboard 50 and an image controlling means 52. The keyboard 2A includes a N-ary counter 54, a selector 56 and the button switch 8. The N-ary counter 54 increments a value in the counter in response to a synchronization signal at a countup trigger input terminal and outputs the incremented value via, for example, the four output terminals $2^0$-$2^3$. Thus, the N-ary counter 54 counts the synchronization signals which are input into the countup trigger terminal, and creates one or more than two continuous level varying signals. The selector 56 selects between five positions, four from the counter 54 and a ground (earth) contact, and outputs an input image signal to a push switch 8. When the push switch 8 is not pressed the circuit is open and no signal is transmitted. However, when the push switch 8 is pressed, the circuit is closed and signal from selector 56 is input as an input signal to the image controlling means 52.

The image controlling means 52 includes a microprocessor 58 which receives via a KEY IN terminal the input signal from the keyboard 2A. The microprocessor 58 also outputs via an OUTSIGNAL terminal a synchronization signal to the countup trigger input of the counter 54. The synchronization signal from the microprocessor 58 ensures that the level changes in the outputs of the counter 54 are detected by the internal sampling of the microprocessor 58.

Figure 2B:
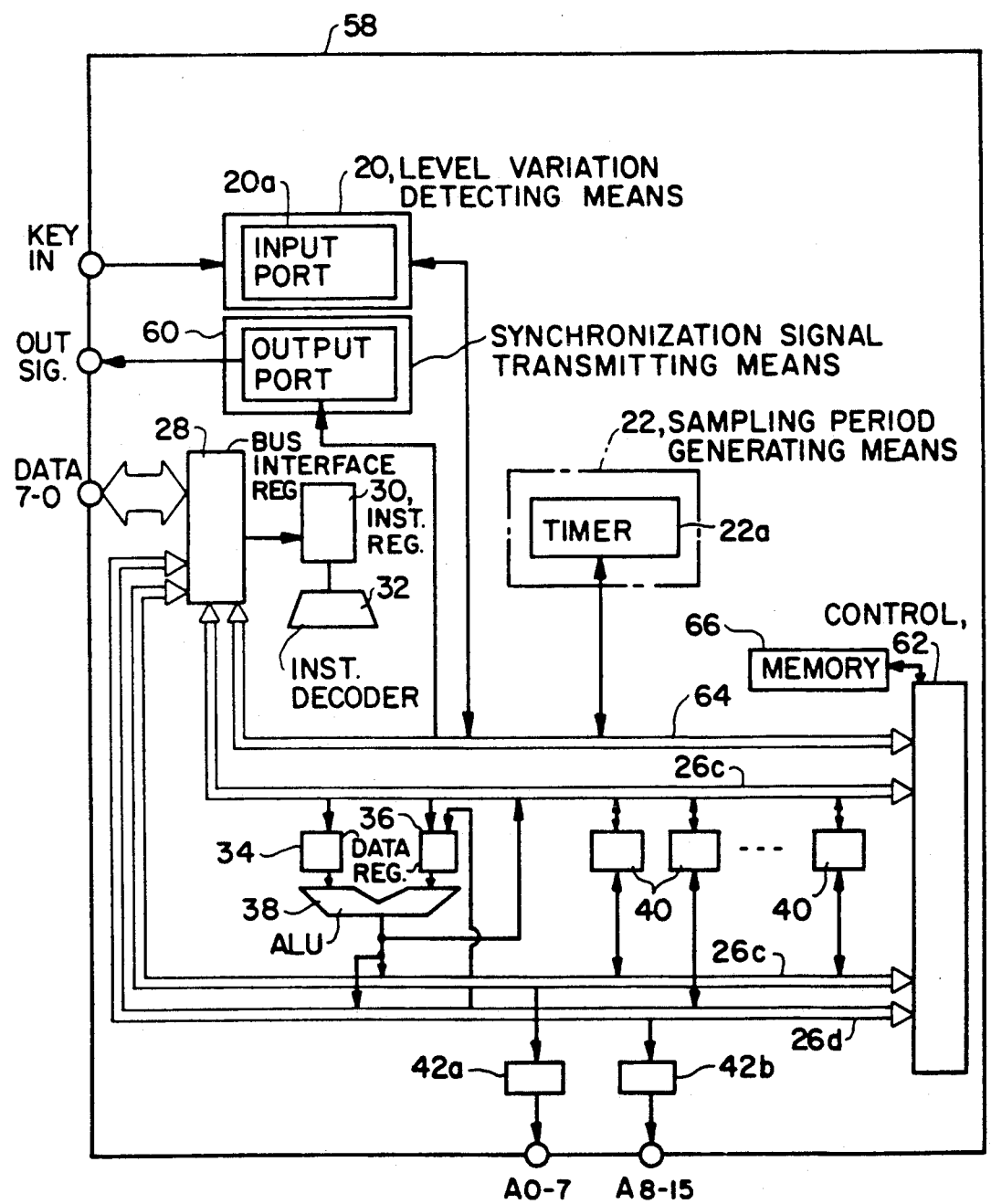
FIG. 2B is a block diagram of a microprocessor of the signal generator of FIG. 2A.

FIG. 2B is a block diagram of the microprocessor 58. The microprocessor 58 includes the sampling period generating means 22 having the timer 22a, the level variation detecting means 20 which includes the input port 20a, and a synchronization signal transmitting means 60. The overhead functions of the level variation detection means 20, the sampling period generating means 22 and the synchronization signal transmitting means 60 are controlled by software executed by a control section 62. The level variation detecting means 20, the sampling period generating means 22 and the synchronization signal transmitting means 60 communicate with the control section 62 via an internal bus 64.

Figure 1B:
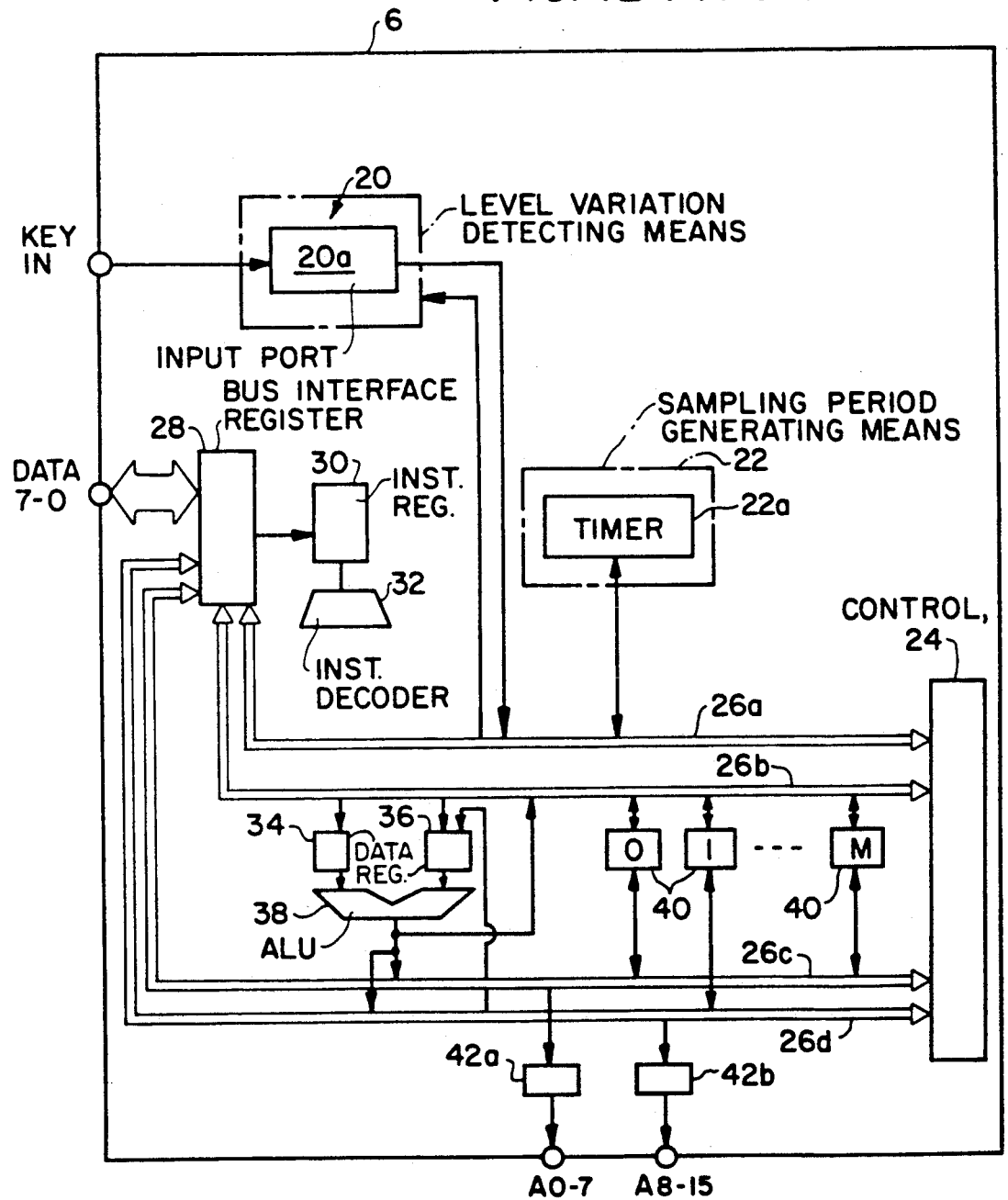
FIG. 1B (PRIOR ART) is a block diagram illustrating a microprocessor of the prior art signal generator of FIG. 1A.

As shown in FIG. 2B, the microprocessor 58 also includes additional devices for general data transfer and addressing (e.g., bus interface register 28), similar to the devices shown in FIG. 1B for the prior art apparatus. Devices in FIG. 2B having the same reference numerals as those devices in FIG. 1B are essentially the same and thus do not need further description.

The sampling period generating means 22 outputs a sample signal to level variation detecting means 20 specifying the period at which the input signal transmitted from the keyboard 50 should be sampled. The specified period is determined from a control frequency command from the control 62. The level variation detecting means 20 receives the sample signal from sampling period generating means 22 and samples the input signal accordingly.

Level variation detecting means 20 detects if the level of the sampled input signal varies from the previously sampled signal by comparing the currently sampled level with the previously sampled level stored in the memory unit 66 of the image controlling means. If a level variation is detected, the level variation detection means 20 judges this variation as either a recognized image signal of an input signal or an actual input signal. Upon the detection of a sync command from the control section 62, the synchronization signal transmitting means 60 outputs a synchronization signal to keyboard 50. The control section 62 generates the sync command at predetermined intervals.

FIG. 3 is an explanatory diagram showing the inputs of the selector 56 and the operation of N-ary counter 54 as the counting means in accordance with the present invention. In the present embodiment, N-ary counter 54 serves as the counting means for counting the synchronization signals generated from synchronization signal transmitting means 60. N-ary counter 54 includes four output terminals ($2^3$, $2^2$, $2^1$, and $2^0$) which are input to the selector 56. In the present embodiment, if the position of selector 56 connects one of the outputs of the N-ary counter 54 to the button switch 8, and if the button switch 8 is pressed, the resulting input signal to the image controlling means 52 is a level-varying signal, the frequency of which depends on the selected output of the N-ary counter 54. For example, the output $2^0$ of the N-ary counter 54 has a level variation which changes at a greater frequency than the output $2^3$ of the N-ary counter 54.

The synchronization signal transmitting means 60 provides synchronization between the input signals received by the image controlling means 52 and the sampling rate of the input signal. In particular, the synchronization signal output by the synchronization signal transmitting means is input to the countup trigger terminal of the N-ary counter 54; thus, the N-ary counter 54 is incremented in response to the synchronization signal.

Figure 4:
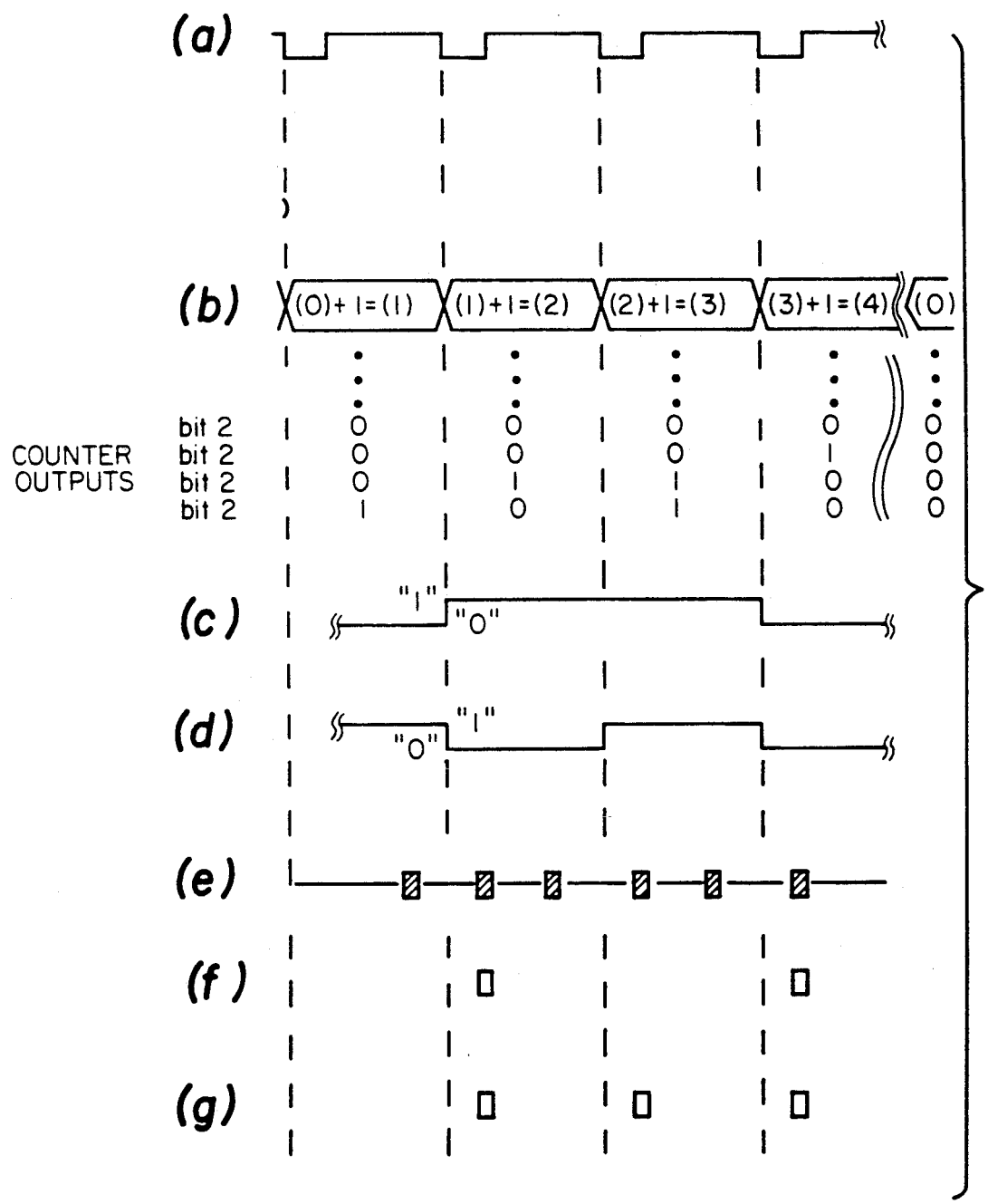
FIG. 4 is a time chart illustrating the operation of the signal generator of the present invention.

FIG. 4 is a time chart illustrating the operation of the signal generator of the present invention. In particular, FIG. 4 shows: synchronization signal (a); N-ary counter signal (b); the output of the selector 56 when the $2^1$ bit of the N-ary counter 54 is selected (c); the output of the selector 56 when the $2^0$ bit of the N-ary counter 54 is selected (d); the sample signal output from the sampling period generating means 22 (e); the recognition of a level variation when the $2^1$ bit of N-ary counter 54 is sampled (f); and the recognition of a level variation when the $2^0$ bit of the N-ary counter 54 is sampled (g).

As shown in FIG. 4, the synchronization signal (a) is output from the synchronization signal transmitting means 60 at a predetermined frequency in accordance with the software executed by the control 62. The counter value (b) output by the N-ary counter 54 is incremented in response to the synchronization signal (a). When the selecting means 56 selects the $2^1$ output of the N-ary counter 54 and button switch 8 is pressed, a level-varying signal (c) is transmitted from keyboard 50 to image controlling means 52. Level variation detecting means 20 samples the input signal according to the sampling signal (c) issued by sampling period generating means 22. As described above, the synchronization signal transmitting means 60 provides synchronization between the input signal and the sampling rate of the input signal. When the level variation detecting means 20 detects any variations (f) between the currently sampled level of input signal and the previously sampled level stored in the memory unit of the image controlling means 52, it judges this variation as a recognized image signal of an input signal or actual input signal.

Similarly, when the selecting means 56 selects the $2^0$ output of N-ary counter 54 and button switch 8 is pressed, a level-varying signal of a higher frequency (d) is transmitted to the image controlling means 52. In this case, the level variations recognized (g) in the sampled input signal (d) occur at a greater frequency than when the selecting means 56 selects the $2^1$ output (c).

The time during which the button switch 8 is manually pressed is in the order of milliseconds (ms), while the level-varying signals (c) and (d) of FIG. 4 vary on the order of microseconds ($\mu$s). Thus, if the selector 56 selects one of the outputs of the N-ary counter 54, a plurality of key inputs (e.g., the pressing of button switch 8) can be recognized based upon the recognition of level variations in the signal input to the image controlling means 52. The resolution in determining the plurality of key inputs can be varied by selecting one of the different bit outputs of the N-ary counter 54. When the level variation detecting means 20 detects a variation in the levels of a currently sampled value and a previously sampled value it adjusts the image signal accordingly so that the output signal (not shown) is an accurate image of the input signal. The output signal may be output, for example, through the bus interface register 28.

As discussed above, keyboard 50 and image controlling means 52 are synchronized so that any level variation in the input signal will surely be detected by the level variation detecting means 20. This allows an accurate sampling of the input signal which is generated by the N-ary counter 54.

While this invention has been shown and described in connection with a particular preferred embodiment, it is apparent that various changes and modification may be made by those who are skilled in the art without departing from the basic features of the invention. Accordingly, it is the intention of the Applicant to protect all variations and modifications within the true spirit and valid scope of the claims.

What is claimed is:

1. A signal generator for generating an image signal of an input signal comprising:
   a keyboard including:
   a counter having two or more outputs at different frequencies, said counter incrementing in response to a synchronization signal;

a button switch having an input terminal and an output terminal, and selector means for selectively connecting the input terminal of the button switch to either one of said outputs of said counter or to a ground terminal, said selector means outputting said image signal to said button switch; and image controlling means for recognizing a level variation in an input signal received from said output terminal of said button switch when said button switch is pressed, said image controlling means including:

means for sampling and storing said input signal at predetermined intervals, said sampling means comparing successive stored samples to detect a level variation in said input signal, and synchronization signal transmitting means for outputting said synchronization signal to said counter in accordance with said predetermined intervals and said detected level variation, said synchronization signal transmitting means providing synchronization so that said level variation is detected by said sampling means.

2. A signal generator as recited in claim 1 wherein said counter is an N-ary counter having four output terminals.

3. A signal generator as recited in claim 2 wherein said selector means selects between any one of said four output terminals.

4. A signal generator as recited in claim 1 wherein said image controlling means further comprises:

sampling period generating means for outputting a sample signal at said predetermined intervals, said predetermined intervals being generated at a frequency in accordance with a control frequency command, said sampling means sampling said input signal in response to said sample signal; and control means for outputting said control frequency command to said sampling period generating means.

5. A signal generator as recited in claim 4, wherein said synchronization signal transmitting means outputs said synchronization signal in response to a sync command from said control means.

6. A method of generating an output signal that is an image of an input signal comprising the steps of:

generating a sampling signal;

supplying an image signal to an input in order to obtain said input signal;

synchronizing the image signal and the sampling signal so that level variations of the input signal occur in synchronization with the sampling signal;

sampling the input signal; and detecting an occurrence of a level variation between two consecutive samples values of the input signal and adjusting said image signal according to any level variation detected, thereby causing the output signal to be an image of the input signal.

7. A method as recited in claim 6 wherein the image signal is generated by a counter which counts the synchronization signals transmitted from a synchronization signal transmitting means.

* * * * *